United States Patent [19]
Huisman et al.

[11] Patent Number: 5,854,117
[45] Date of Patent: Dec. 29, 1998

[54] METHOD OF MANUFACTURING A VARICAP DIODE, A VARICAP DIODE, A RECEIVER DEVICE, AND A TV RECEIVER SET

[75] Inventors: Frederikus R. J. Huisman; Oscar J. A. Buyk, both of Eindhoven, Netherlands; Wolfgang Bindke, Buchholz, Germany

[73] Assignee: U.S. Philips Corporation, New York, N.Y.

[21] Appl. No.: 715,059

[22] Filed: Sep. 17, 1996

[30]    Foreign Application Priority Data

Sep. 18, 1995   [EP]   European Pat. Off. ............. 95202519

[51] Int. Cl.$^6$ .......................... H01L 21/20; H01L 21/425
[52] U.S. Cl. ............................................ 438/379; 438/527
[58] Field of Search .................................... 438/376, 377, 438/378, 379, 340, 342, 527

[56]    References Cited

U.S. PATENT DOCUMENTS

| | | | |
|---|---|---|---|
| 4,104,085 | 8/1978 | Zandveld | 438/379 |
| 4,106,953 | 8/1978 | Onodera | 438/379 |
| 4,475,117 | 10/1984 | Raabe | 357/14 |
| 4,534,806 | 8/1985 | Magdo | 148/1.5 |
| 4,569,123 | 2/1986 | Ishil et al. | 29/5 |
| 4,656,498 | 4/1987 | Hewlett | 357/50 |
| 4,868,134 | 9/1989 | Kasahara | 438/379 |
| 5,197,077 | 3/1993 | Harding et al. | 372/45 |

FOREIGN PATENT DOCUMENTS

| | | |
|---|---|---|
| 5669869 | 6/1981 | Japan . |
| 6247166 | 2/1987 | Japan . |

OTHER PUBLICATIONS wolf, Stanley "Silicon Processing For the VLSI Era Vol. 1: Process Technology", Lattice Press, pp. 321–327, 1986.

*Primary Examiner*—John Niebling
*Assistant Examiner*—Michael S. Lebentritt
*Attorney, Agent, or Firm*—Steven R. Biren

[57]    ABSTRACT

The invention relates to a method of manufacturing a varicap diode whereby a silicon substrate with an epitaxial layer of a first conductivity type is provided with a first zone through the provision of dopant atoms of a first conductivity type in the epitaxial layer and is provided with a second zone adjoining a surface of the epitaxial layer through the provision of dopant atoms of a second conductivity type opposed to the first in the epitaxial layer, a pn junction being formed between the second zone and the first zone. According to the invention, the method is characterized in that the second zone is provided in that a layer of polycrystalline silicon provided with dopant atoms of the second conductivity type is provided on the surface, and in that the dopant atoms are diffused from this layer into the epitaxial layer, whereby a pn junction is formed at a distance of less than 0.3 $\mu$m from the polycrystalline silicon. The measure according to the invention leads to the manufacture of a varicap diode with a pn junction which shows a wide variation in capacitance of the depleted region around the pn junction for a comparatively small variation in reverse voltage across the pn junction.

6 Claims, 3 Drawing Sheets

METHOD OF MANUFACTURING A VARICAP DIODE, A VARICAP DIODE, A RECEIVER DEVICE, AND A TV RECEIVER SET

BACKGROUND OF THE INVENTION

The invention relates to a method of manufacturing a varicap diode whereby a silicon substrate with an epitaxial layer of a first conductivity type is provided with a first zone through the provision of dopant atoms of a first conductivity type in the epitaxial layer and is provided with a second zone adjoining a surface of the epitaxial layer through the provision of dopant atoms of a second conductivity type opposed to the first in the epitaxial layer, a pn junction being formed between the second zone and the first zone. The invention also relates to a varicap diode, a receiver device, and a TV receiver set.

A varicap diode is a diode with a pn junction which is reverse-biased during use by a reverse voltage across the pn junction. The region around the pn junction is depleted of charge carriers in that case and acts as a dielectric of a capacitance. The value of this capacitance can be controlled by means of the reverse voltage. The higher the reverse voltage, the larger the depleted region and the lower the capacitance. The varicap diode is often used as a variable capacitance in applications where an LC circuit (L coil, C capacitance) is tuned. The circuit can be tuned, for example, to a different frequency in that the capacitance C is changed. Varicap diodes are widely used, for example, in receiver devices of TV sets.

U.S. Pat. No. 4,475,117 discloses a method of the kind mentioned in the opening paragraph.

The known method described has the disadvantage that varicap diodes manufactured by the known method require a comparatively high voltage variation in order to obtain a sufficient variation in capacitance. Thus a varicap diode manufactured by the known method has a capacitance change of approximately 20 pF for a voltage change of approximately 25 V (see FIG. 5 in U.S. Pat. No. 4,475,117). Such a high voltage variation is disadvantageous for many applications, especially for portable applications with battery supplies. A special circuit is required then for supplying the required major voltage variation.

The invention has for its object inter alia to counteract this disadvantage by means of a method of making a varicap diode which has a comparatively great capacitance change accompanying much smaller voltage variations.

According to the invention, the method is for this purpose characterized in that the second zone is provided through the provision on the surface of a layer of polycrystalline silicon provided with dopant atoms of the second conductivity type, and in that the dopant atoms are diffused from this layer into the epitaxial layer, whereby a pn junction is formed at a distance of less than 0.3 μm from the polycrystalline silicon.

A comparatively shallow, sharp pn junction is manufactured by the measure according to the invention, i.e. there is an abrupt transition from material of the second to material of the first conductivity type, the doping profile being very steep, i.e. the concentration of dopant atoms of the first conductivity type drops sharply as a function of the depth below the surface. It is found that a varicap diode with a sharp pn junction having such a doping profile exhibits a much greater capacitance change for much lower reverse voltages across the diode. The known varicap diode has a pn junction at a depth of approximately 1 μm below the surface, while the doping profile has a gradient which is much less steep.

The polycrystalline silicon layer may be doped in situ in that dopant atoms are added during deposition of the layer. Since the deposition of polycrystalline silicon usually takes place at a comparatively high temperature, however, some diffusion of dopant atoms from the polycrystalline into the epitaxial layer will take place then during deposition already. Preferably, the layer of polycrystalline silicon provided with dopant atoms is provided in that first a non-doped layer of polycrystalline silicon is provided and subsequently the dopant atoms are provided through ion implantation into the layer of polycrystalline silicon, but not into the epitaxial layer. No problems arise in this method as regards diffusion of dopant atoms during deposition of the polycrystalline layer.

Dopant atoms of the first conductivity type used may be, for example, phosphorus, antimony, or arsenic atoms. Preferably, the dopant atoms of the first conductivity type comprise arsenic atoms. Arsenic atoms diffuse with comparatively great difficulty, so that a doping profile once provided is not disturbed by diffusion, and it is comparatively simple to manufacture a doping profile with a very steep gradient.

An additional advantage is obtained when the dopant atoms of the second conductivity type are diffused from the polycrystalline layer into the epitaxial layer at a temperature of 850° C. or lower. A shallow pn junction is comparatively easy to realize at this comparatively low temperature. The diffusion time becomes short at a higher diffusion temperature, which renders the diffusion process more difficult to control, and the dopant atoms may easily diffuse too deeply, so that no sharp pn junction is obtained.

Preferably, before the first zone is provided, a comparatively deep third zone is provided in the epitaxial layer through the provision of dopant atoms of a first conductivity type in the epitaxial layer, after which a comparatively shallow first zone is provided in said third zone. The combination of a shallow first zone and a deep third zone of a first conductivity type with different implantations provides more possibilities of choosing a doping gradient such that a desired capacitance:voltage curve is achieved. The desirability of this third zone is determined inter alia by the voltage:capacitance variation required for the application. The first zone usually has a steep doping profile, whereas the deep third zone provides a more fluent gradient of the capacitance as a function of the reverse voltage at higher voltages, which has a favorable effect on the tuning behavior of a receiver device in which the varicap diode is used.

The first and second zones may be provided by means of different masks. Preferably, the first zone and a third zone, if present, are provided through an opening in a mask, after which said opening is enlarged without the use of an additional mask, and the second zone is provided through said enlarged opening. It is possible in that case to provide the two zones mutually aligned by means of only one mask. The mask is a standard mask which is provided by means of photolithographic techniques and an etching process. The opening in the mask may be enlarged, for example, in that material of the mask is etched away in an isotropic etching process. The thickness of the mask becomes smaller then and the opening in the mask greater.

The invention also relates to a varicap diode with a substrate, an epitaxial silicon layer of a first conductivity type disposed thereon, a first zone situated in the epitaxial layer and containing dopant atoms of the first conductivity type but more strongly doped than the epitaxial layer, and a second surface zone containing dopant atoms of a second conductivity type opposed to the first and forming a pn junction with the first zone.

Such a varicap diode is known from U.S. Pat. No. 4,475,117.

The known varicap diode described therein has the disadvantage that a comparatively great voltage variation is necessary for obtaining a sufficient variation in capacitance. Thus the known varicap diode has a capacitance change of approximately 20 pF for a voltage variation of approximately 33 V. Such a great voltage variation is disadvantageous in many applications, especially portable applications with battery supplies. A special circuit is necessary in that case which can supply the required major voltage variation.

SUMMARY OF THE INVENTION

The invention has for its object inter alia to counteract said disadvantage by supplying a varicap diode which has a comparatively great capacitance change accompanying much lower voltages.

According to the invention, the varicap diode is for this purpose characterized in that the second surface zone is covered with a polycrystalline silicon layer doped with the dopant atoms of the second conductivity type, the pn junction being at a distance of less than 0.3 $\mu$m from the polycrystalline silicon. It is achieved thereby that the varicap diode according to the invention will show a much greater capacitance change for much lower reverse voltages across the diode.

The varicap diode according to the invention may be used to advantage in a receiver device of a TV set. Such a receiver device is tuned to a signal received through an antenna. A tuned LC circuit is often used in the receiver device, provided with a varicap diode as a variable tuning element C for tuning the receiver device to the antenna signal.

Known receiver devices require a supply voltage of approximately 33 V for obtaining a sufficient tuning range. Such a high supply voltage is disadvantageous because in many cases it has to be separately generated. A separate device is then present in the TV set for generating this supply voltage. This renders the TV set more complicated and expensive.

The invention has for its object to provide a receiver device which does not require a high supply voltage but nevertheless can be tuned over a wide frequency range.

The receiver device according to the invention is for this purpose characterized in that the receiver device is provided with a varicap diode according to the invention or with a varicap diode manufactured by a method according to the invention. A comparatively low supply voltage can suffice for such a receiver device because the varicap diode needs only a small reverse voltage variation for achieving a comparatively great capacitance change.

The application also relates to a TV set provided with a receiver device according to the invention. Such a TV set does not require a special device for generating a comparatively high supply voltage of approximately 33 V. The TV set as a result is simpler and more energy-efficient than known TV sets. This is a major advantage, especially in the case of portable TV sets which are battery-operated.

BRIEF DESCRIPTION OF THE DRAWING

The invention will be explained in more detail below by way of example with reference to drawing in which.

DESCRIPTION OF THE PREFERRED EMBODIMENTS

Figure 1:
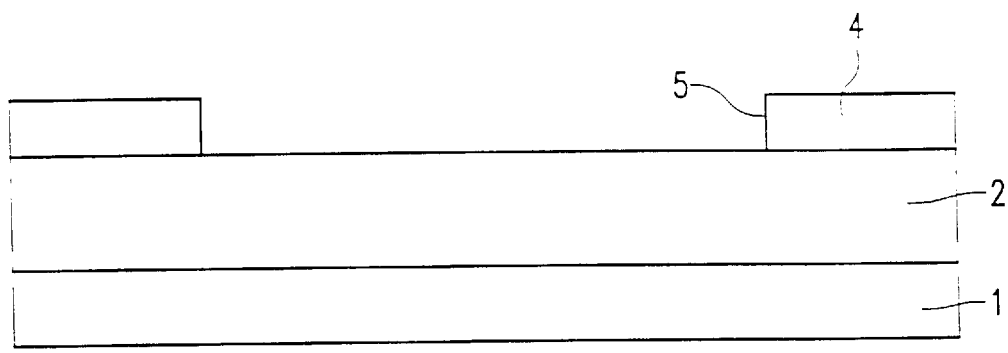
FIGS. 1 to 5 show various stages in the manufacture of a varicap diode according to the invention.

The Figures are purely diagrammatic and not drawn to scale. Corresponding parts have generally been given the same reference numerals in the Figures.

FIG. 1 shows a silicon substrate 1, in this example a low-ohmic, Sb-doped $n^{++}$ silicon wafer with an epitaxial layer 2 of a first conductivity type, an n-type in this example. Varicap diodes are manufactured in the embodiments suitable for use in a receiver device of a TV set for the VHF Low Band: 48–170 MHz, the VHF Mid Band: 170–460 MHz, and for the UHF Band: 470–860 MHz. The thickness and doping of the epitaxial layer are determined by the application (capacitance:reverse voltage curve) and by the desired low series resistance of the varicap diode (see Table 1). The thicknesses given in Table 1 are thicknesses at the start of manufacture. The eventual thicknesses of the epitaxial layer in the finished varicap diode are smaller owing to oxidation of the epitaxial layer and diffusion of dopant atoms from the substrate into the epitaxial layer during manufacture of the varicap diode.

TABLE 1 phosphorus doping and layer thickness of the epitaxial layer 2 of varicap diodes suitable for different frequency ranges.

| Frequency band | Layer thickness [$\mu$m] | Dose [at./cm$^2$] |
| --- | --- | --- |
| VHF Low Band | 4.0 | 1 * 10$^{15}$ |
| VHF Mid Band | 3.4 | 31 * 10$^{15}$ |
| UHF Band | 2.8 | 5 * 10$^{15}$ |

Figure 2:
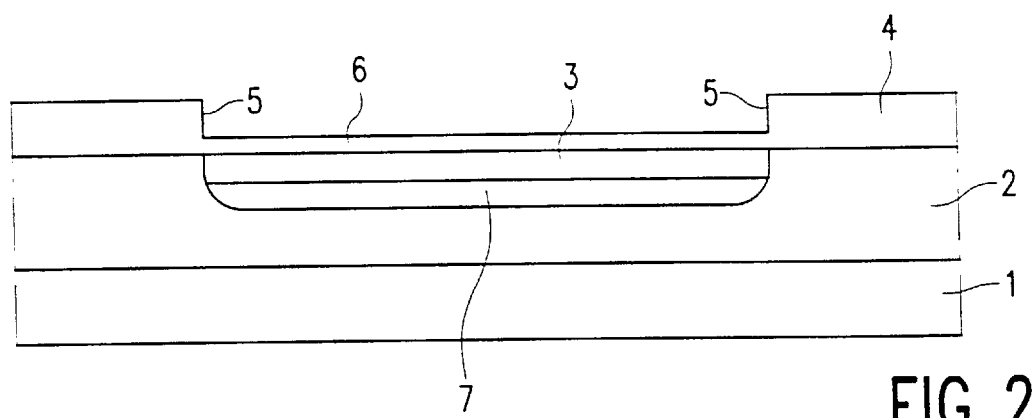

The epitaxial layer 2 is provided with a first zone 3 through the provision of dopant atoms of a first conductivity type in the epitaxial layer 2 (see FIG. 2). A masking layer 4 is for this purpose provided on the surface of the epitaxial layer 2, in this example a 1.2 $\mu$m thick silicon oxide (field oxide) layer. This layer 4 is patterned by a standard lithographic process, whereby a mask with an opening 5 is formed. Then a 30 nm thick scattering oxide 6 is grown with the purpose of achieving a more uniform distribution of dopant atoms in subsequent implantations. In the present example, a third zone 7 is first formed through a comparatively deep implantation of dopant atoms with an implantation energy of 80 keV through the opening 5. Dopant atoms, implantation doses, and heat treatment times and temperatures are given in Table 2 below.

TABLE 2 dopant atoms, dose, time and temperature of after-treatment for formation of third zone 7 for varicap diodes suitable for different frequency ranges.

| Frequency - band | Dopant atom | Dose [at./cm$^2$] | After-treatment time [min] | After-treatment temperature [°C.] |
| --- | --- | --- | --- | --- |
| VHF Low Band | P | 6 * 10$^{11}$ | 40 | 1100 |
| VHF Mid Band | As | 6 * 10$^{11}$ | 30 | 1140 |
| UHF Band | As | 4 * 10$^{11}$ | 30 | 1140 |

The comparatively shallow first zone 3 is provided in the third zone 7 through implantation of arsenic atoms through the opening 5. Implantation doses and energies are given in Table 3 below.

TABLE 3 dose and implantation energy for formation of first zone 3 for varicap diodes suitable for different frequency ranges.

| Frequency band | dose | implantation energy [keV] |
| --- | --- | --- |
| VHF Low Band | $4.3 * 10^{13}$ | 70 |
| VHF Mid Band | $2.6 * 10^{13}$ | 80 |
| UHF Band | $2.3 * 10^{13}$ | 80 |

Figure 3:
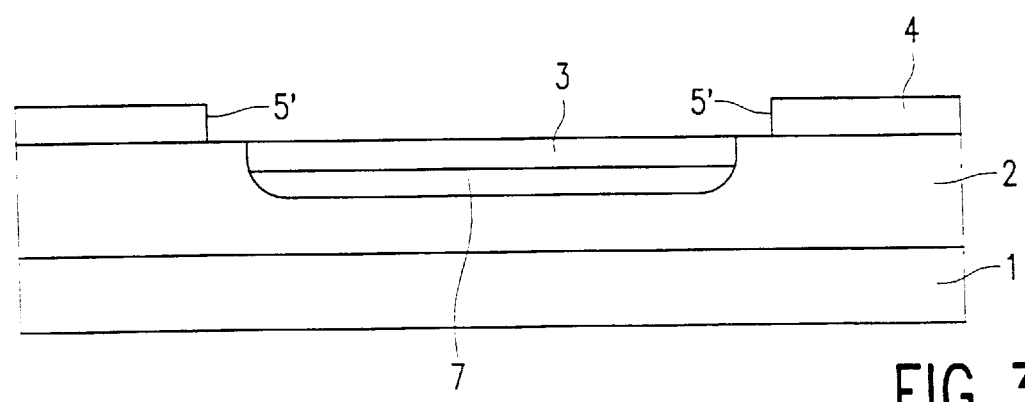
Figure 4:
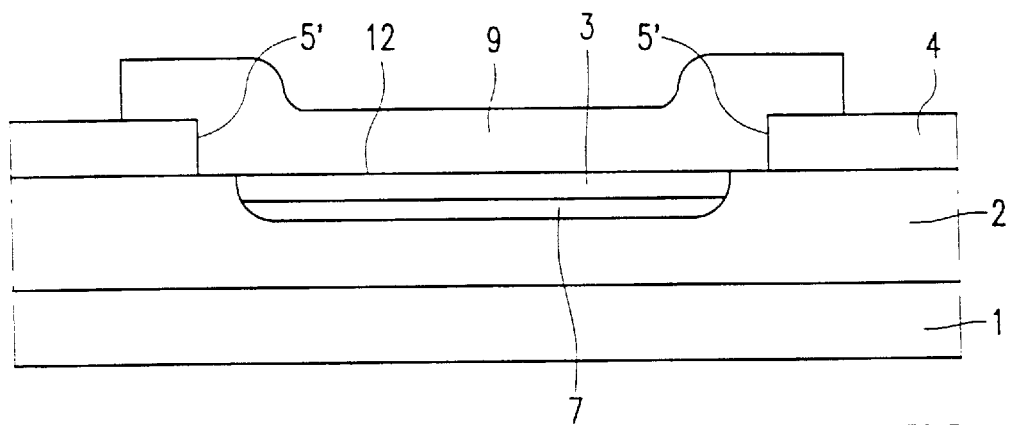

The first zone 3 is then given an aftertreatment at 900° C. for 30 minutes. Subsequently, a second zone 8 of a second conductivity type is provided in the first zone 3. The first zone 3 and the second zone 8 may be provided by means of different masks. In the present example, the first zone 3 is provided through an opening 5 in a mask 4, after which the opening 5 is enlarged into an enlarged opening 5' without the use of an additional mask, whereupon the second zone 8 is provided through the enlarged opening 5'. It is thus possible to provide the two zones 3 and 8 mutually aligned by means of only one mask 4. The opening 5 in the mask 4 may be enlarged in that material is etched away from the mask in an isotropic etching process. The thickness of the oxide of the mask 4 decreases from 1.2 to 0.5 μm during this, and the opening 5 in the mask becomes approximately 1.4 μm greater (see FIG. 3). A second zone 8 adjoining a surface 12 of the epitaxial layer is provided through the enlarged opening 5' in that dopant atoms of a second conductivity type opposed to the first are introduced into the epitaxial layer, whereby a pn junction 15 is formed between the second zone and the first zone. According to the invention, the second zone is provided in that a layer 9 of polycrystalline silicon provided with dopant atoms of the second conductivity type is applied over the surface 12 (see FIG. 4). In this example, a 300 nm thick, non-doped layer 9 of polycrystalline silicon is first provided on the surface 12 of the epitaxial layer 2. Then boron doping atoms are provided in the layer 9 of polycrystalline silicon, but not in the epitaxial layer 2. For this purpose, boron ions are implanted into the polycrystalline silicon layer by ion implantation with an implantation energy of 30 keV and a dose of $5*10^5/cm^2$. The implantation energy of the boron ions must be below 40 keV for this thickness of the polycrystalline silicon, because part of the boron will be implanted into the epitaxial layer 2 at implantation energies above 40 keV already. There is no problem with dopant atoms diffusing away during deposition of the polycrystalline layer in this method because no boron atoms are present in the polycrystalline layer yet during deposition. The doped layer 9 is patterned by standard lithographic techniques. Boron doping atoms are diffused into the epitaxial layer 2 from the doped layer 9. An additional advantage is obtained when the dopant atoms of the second conductivity type are diffused from the polycrystalline layer into the epitaxial layer at a temperature of 850° C. or lower. A shallow pn junction is comparatively easy to realize at this comparatively low temperature. The diffusion time becomes short at a higher diffusion temperature, which renders the diffusion process difficult to control and dopant atoms may readily diffuse too deeply. In the present example, a heat treatment of approximately 40 minutes at 850° C. is used, whereby a pn junction 15 is formed at a distance of less than 0.3 μm from the polycrystalline silicon 9, here a distance of 0.06 μm (see FIG. 5). Then a 0.5 μm thick aluminum layer 10 is provided on the surface and patterned by standard lithographic and etching techniques. This aluminum layer 10 serves to contact the polysilicon layer 9. The device is further provided with a passivating layer 11 of 0.75 μm silicon nitride in a standard manner by a PECVD process. Then the substrate is subdivided into individual varicap diodes which are each given a final mounting in an envelope.

Figure 5:
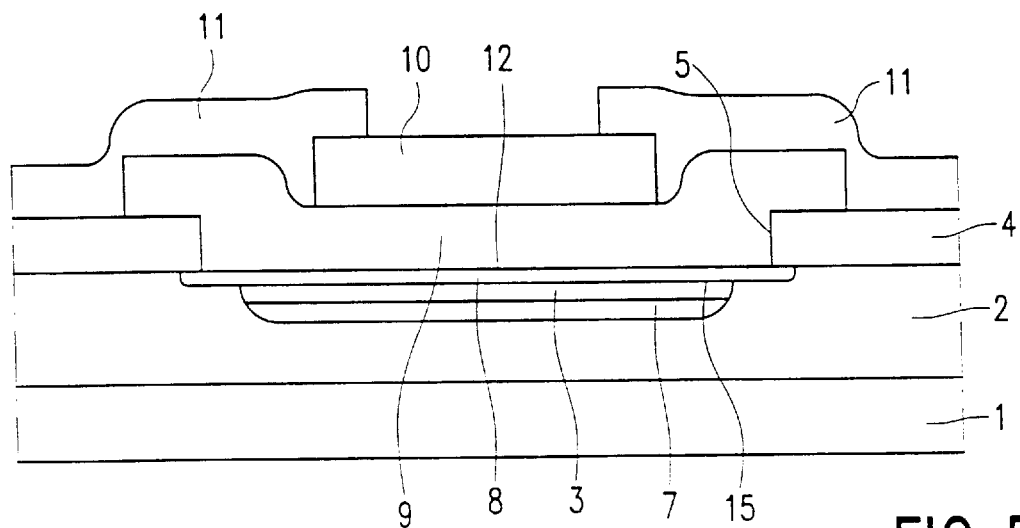

FIG. 5 shows a varicap diode with a substrate 1, an epitaxial silicon layer 2 of a first conductivity type disposed thereon, a first zone 3 in the epitaxial layer and containing dopant atoms of the first conductivity type, but doped more strongly than the epitaxial layer 2, and a second surface zone 8 with dopant atoms of a second conductivity type opposed to the first, forming a pn junction 15 with the first zone. According to the invention, the varicap diode is characterized in that the second surface zone 8 is covered with a polycrystalline silicon layer 9 doped with the dopant atoms of the second conductivity type, while the pn junction 15 is at a distance of less than 0.3 μm from the polycrystalline silicon 9.

Figure 6:
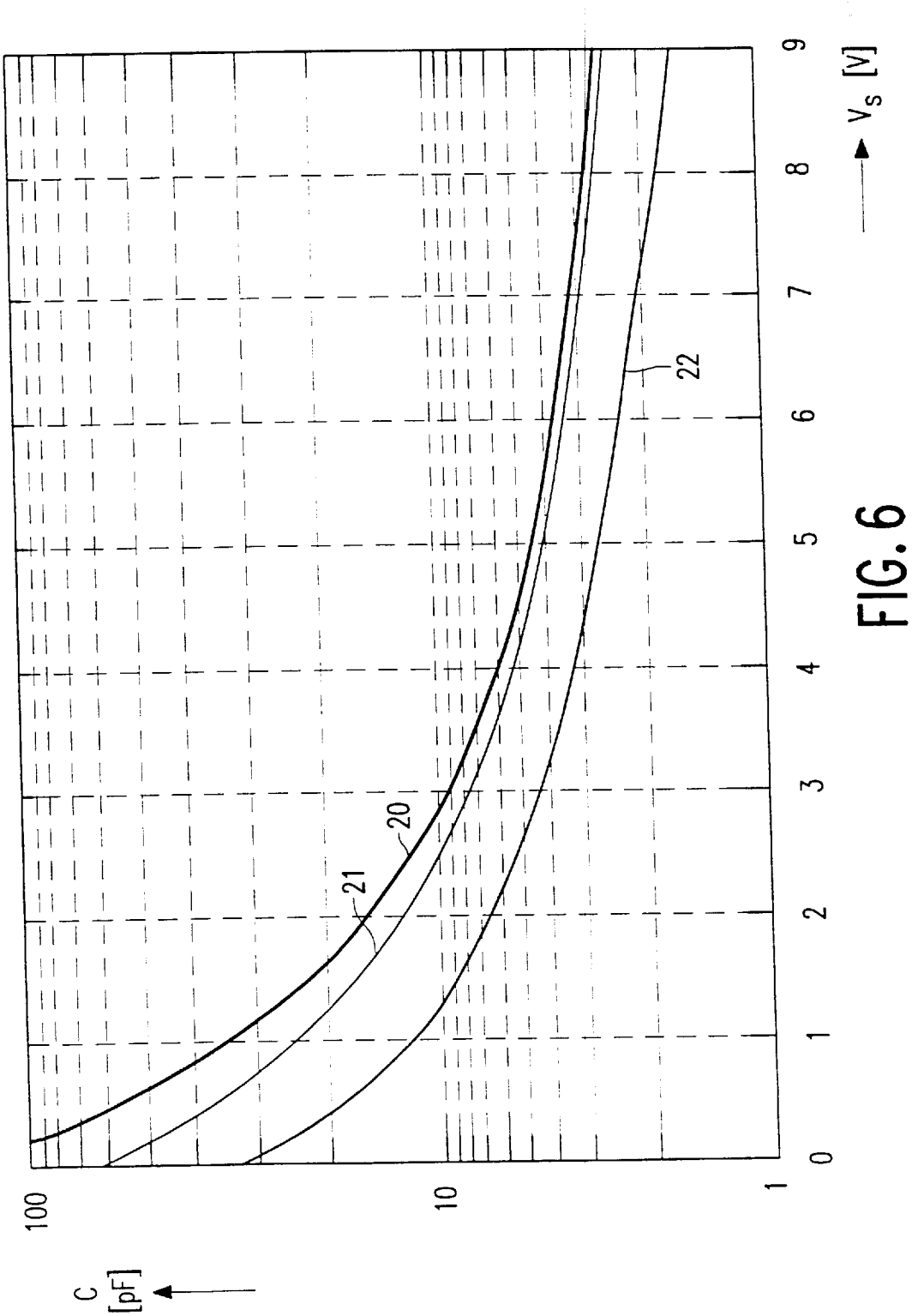

FIG. 6 shows capacitance: voltage characteristics of varicap diodes according to the invention suitable for frequency ranges in the VHF Low (curve 20), VHF Mid (curve 21), and UHF (curve 22) bands. A capacitance C of a varicap diode is plotted on the vertical axis in the Figure, and the reverse voltage $V_s$ across the varicap diode on the horizontal axis. The varicap diodes according to the invention show a capacitance variation of approximately 40 pF for a voltage variation of approximately 8 V across the varicap diode. Varicap diodes according to the invention thus have a great capacitance change for comparatively low reverse voltages across the diode. The varicap diodes according to the invention have a series resistance which is practically equal to that of known varicap diodes.

The invention is not limited to the embodiments and applications described above. Thus varicap diodes for specific frequency bands of a TV receiver set were manufactured in the examples. It will be obvious that varicap diodes for other frequency bands may also be manufactured through adaptation of the epitaxial layer and the first, second and third zones. According to the invention, for example, varicap diodes may also be used suitable for frequency bands from approximately 250 MHz to 3 GHz for telecommunication purposes. It is also possible to manufacture varicap diodes with a comparatively low so-called capacitance ratio (=capacitance variation/reverse voltage variation), for example, a capacitance variation of a factor three for a reverse voltage variation of approximately 10 V. Known varicap diodes also have such a low capacitance ratio, but in that case the series resistance of the varicap diode is comparatively high. The varicap diode according to the invention has a low series resistance owing to the adaptation of the thickness of the epitaxial layer.

Certain techniques were mentioned above for manufacturing the varicap diode. This does not mean that the method according to the invention can only be implemented by such techniques. Thus, for example, implantation of dopant atoms into the polycrystalline layer may be replaced by an alternative technique such as deposition in a low-temperature CVD process, for example at 750° C. More details on known techniques may be found in handbooks such as S. M. Sze: "VLSI Technology", Mc-Graw-Hill Book Company and S. Wolf: "Silicon Processing for the VLSI Era", Vols. 1, 2, Lattice Press.

We claim:

1. A method of manufacturing a varicap diode comprising providing a silicon substrate with an epitaxial layer of a first conductivity type with a first zone by providing dopant atoms of a first conductivity type in the epitaxial layer and with a second zone adjoining a surface of the epitaxial layer by providing dopant atoms of a second conductivity type opposed to the first in the epitaxial layer, forming a pn junction between the second zone and the first zone, characterized in that the second zone is provided by providing a layer of polycrystalline silicon having dopant atoms of the second conductivity type on the surface, and diffusing the dopant atoms from this layer into the epitaxial layer to form a pn junction at a distance of less than 0.3 $\mu$m from the polycrystalline silicon.

2. A method as claimed in claim 1, characterized in that the layer of polycrystalline silicon provided with dopant atoms is provided in that first a non-doped layer of polycrystalline silicon is provided and subsequently the dopant atoms are provided through ion implantation into the layer of polycrystalline silicon, but not into the epitaxial layer.

3. A method as claimed claim 1, characterized in that the dopant atoms of the first conductivity type comprise arsenic atoms.

4. A method as claimed in claim 1, characterized in that the dopant atoms of the second conductivity type are diffused from the polycrystalline layer into the epitaxial layer at a temperature of 850° C. or lower.

5. A method as claimed in claim 1, characterized in that, before the first zone is provided, a comparatively deep third zone is provided in the epitaxial layer through the provision of dopant atoms of a first conductivity type in the epitaxial layer, after which a comparatively shallow first zone is provided in said third zone.

6. A method as claimed in claim 1, characterized in that the first zone is provided through an opening in a mask, after which said opening is enlarged without the use of an additional mask, and the second zone is provided through said enlarged opening.

* * * * *